US012626041B2

(12) United States Patent
Hughes et al.

(10) Patent No.: US 12,626,041 B2
(45) Date of Patent: *May 12, 2026

(54) METHOD AND SYSTEM FOR USING DEEP LEARNING TO IMPROVE DESIGN VERIFICATION BY OPTIMIZING CODE COVERAGE, FUNCTIONAL COVERAGE, AND BUG DETECTION

(71) Applicant: VERIFAI INC., Palo Alto, CA (US)

(72) Inventors: William Alexander Hughes, San Jose, CA (US); Sandeep Srinivasan, Palo Alto, CA (US); Rohit Uday Suvarna, Jersey City, NJ (US)

(73) Assignee: VERIFAI INC., Palo Alto, CA (US)

( * ) Notice: Subject to any disclaimer, the term of this patent is extended or adjusted under 35 U.S.C. 154(b) by 716 days.

This patent is subject to a terminal disclaimer.

(21) Appl. No.: 17/989,793

(22) Filed: Nov. 18, 2022

(65) Prior Publication Data

US 2023/0153500 A1 May 18, 2023

Related U.S. Application Data

(60) Provisional application No. 63/280,987, filed on Nov. 18, 2021.

(51) Int. Cl.
*G06F 30/27* (2020.01)
*G06F 30/3308* (2020.01)
(Continued)

(52) U.S. Cl.
CPC ........ *G06F 30/3308* (2020.01); *G06F 30/392* (2020.01); *G06F 30/398* (2020.01); *G06N 3/08* (2013.01); *G06N 20/00* (2019.01)

(58) Field of Classification Search
CPC .. G06F 30/3308; G06F 30/392; G06F 30/398; G06F 30/27; G06N 3/08;
(Continued)

(56) References Cited

U.S. PATENT DOCUMENTS 6,742,166 B2 * 5/2004 Foster ..................... G06F 30/33
716/106
9,514,036 B1 12/2016 Dusanapudi
(Continued)

OTHER PUBLICATIONS

Kuhn et al. "Practical Combinatorial Testing," National Institute of Standards and Technology, Oct. 2010, Special Publication 800-142, 82 pages.
(Continued)

*Primary Examiner* — Nghia M Doan
(74) *Attorney, Agent, or Firm* — Sheridan Ross P.C.

(57) ABSTRACT

Methods, systems, and devices for tuning a set of simulation parameters associated with a design verification environment are described that include: simulating a circuit design according to a set of simulation parameters; providing, to a machine learning network, an indication of functional coverage results associated with simulating the circuit design according to the set of simulation parameters; receiving an output in response to the machine learning network processing the functional coverage results; and simulating the circuit design based on a recommended set of simulation parameters, wherein simulating the circuit design based on the recommended set of simulation parameters includes generating a set of component signals associated with satisfying a target functional coverage statement. In some aspects, the output includes: the target functional coverage statement associated with the circuit design; and the recommended set of the simulation parameters.

20 Claims, 12 Drawing Sheets

1000

(51) Int. Cl.

| | |
|---|---|
| *G06F 30/392* | (2020.01) |
| *G06F 30/398* | (2020.01) |
| *G06N 3/08* | (2023.01) |
| *G06N 20/00* | (2019.01) |

(58) Field of Classification Search
CPC ........ G06N 20/00; G06N 3/006; G06N 3/044; G06N 3/045; G06N 3/047; G06N 5/01; G06N 7/01
See application file for complete search history.

(56) References Cited

U.S. PATENT DOCUMENTS

| | | | | |
|---|---|---|---|---|
| 11,250,191 | B1 * | 2/2022 | Bachchu | ............... G06F 30/327 |
| 11,842,130 | B1 * | 12/2023 | Khatun | ................. G06F 30/367 |
| 2012/0110087 | A1 | 5/2012 | Culver | |
| 2017/0177765 | A1 | 6/2017 | Dusanapudi | |
| 2020/0019664 | A1 | 1/2020 | Dutta | |
| 2020/0042434 | A1 | 2/2020 | Albertson | |
| 2021/0319158 | A1 * | 10/2021 | Bhattacharyya | ... G06Q 30/0205 |
| 2022/0129613 | A1 | 4/2022 | Jindal | |
| 2022/0261654 | A1 * | 8/2022 | Wu | ......................... G06F 30/27 |

OTHER PUBLICATIONS

Sorin et al. "A Primer on Memory Consistency & Cache Coherence," Morgan & Claypool, 2011, 214 pages.
Notice of Allowance for U.S. Appl. No. 17/989,805, dated Aug. 14, 2025, 10 pages.

\* cited by examiner

600

700

KNOB SETTINGS - FOR NEXT SIMULATIONS

DV ENV

REWARD(S) - FIFO DEPTH

SIMULATION RESULTS - KNOB SETTINGS

VERIFAI-RL AGENT

900

905

METHOD AND SYSTEM FOR USING DEEP LEARNING TO IMPROVE DESIGN VERIFICATION BY OPTIMIZING CODE COVERAGE, FUNCTIONAL COVERAGE, AND BUG DETECTION

CROSS-REFERENCE TO RELATED APPLICATIONS

The present application claims the benefit of and priority, under 35 U.S.C. § 119(e), to U.S. Provisional Application Ser. No. 63/280,987 filed Nov. 18, 2021, entitled "Method and System for Using Deep Learning to Improve Design Verification by Optimizing Code Coverage, Functional Coverage and Bug Detection," the entire disclosures of which are hereby incorporated herein by reference, in their entirety, for all that the disclosures teach and for all purposes.

FIELD OF TECHNOLOGY

The present disclosure is related generally to artificial intelligence, including using deep learning for design verification.

BACKGROUND

Design verification of integrated circuits may involve generating a stimulus of input signals and then evaluating the resulting output signals against expected values. Such stimulus generation and evaluation of output signals allows design simulations to be conducted to determine whether a design is operating correctly. Techniques for improving design verification are desired.

SUMMARY

A system is described including: a processor; and a memory storing instructions thereon that, when executed by the processor, cause the processor to: simulate a circuit design according to a set of simulation parameters; provide, to a machine learning network, an indication of functional coverage results associated with simulating the circuit design according to the set of simulation parameters; receive an output in response to the machine learning network processing the functional coverage results; and simulate the circuit design based on a recommended set of simulation parameters, wherein simulating the circuit design based on the recommended set of simulation parameters includes generating a set of component signals associated with satisfying a target functional coverage statement. In some aspects, the output includes: the target functional coverage statement associated with the circuit design; and the recommended set of the simulation parameters.

Any of the aspects herein, wherein: the set of simulation parameters are provided by the machine learning network; and the instructions are further executable by the processor to provide training data to the machine learning network based on the functional coverage results, wherein providing the training data includes providing positive reinforcement, negative reinforcement, or both with respect to the set of simulation parameters and the functional coverage results.

Any of the aspects herein, wherein the machine learning network includes a reinforcement learning network.

Any of the aspects herein, wherein values of the set of simulation parameters are selected by the machine learning network as having a highest reward among candidate values of the set of simulation parameters.

Any of the aspects herein, wherein the candidate values are randomly selected by the machine learning network.

Any of the aspects herein, wherein processing the functional coverage results by the machine learning network includes tracking the coverage results as a function of the set of simulation parameters.

Any of the aspects herein, wherein the set of simulation parameters include: one or more input conditions associated with simulating the circuit design; and one or more verification parameters associated with setting the one or more input conditions.

Any of the aspects herein, wherein the set of simulation parameters include one or more verification environment parameters.

Any of the aspects herein, wherein the set of simulation parameters include one or more design configuration parameters.

Any of the aspects herein, wherein: the functional coverage results associated with simulating the circuit design according to the set of simulation parameters include an indication of a first quantity of functional coverage statements satisfied in response to the simulation; and second functional coverage results associated with simulating the circuit design according to the recommended set of simulation parameters include an indication of a second quantity of the functional coverage statements satisfied in response to the simulation, wherein the second quantity is larger than the first quantity.

Any of the aspects herein, wherein a result associated with simulating the circuit design based on the recommended set of simulation parameters includes an increased probability of satisfying the target functional coverage statement.

Any of the aspects herein, wherein a result associated with simulating the circuit design based on the recommended set of simulation parameters includes achieving a target frequency associated with satisfying the target set of functional coverage statements associated with the circuit design.

Any of the aspects herein, wherein the instructions are further executable by the processor to: simulate the circuit design according to a plurality of configurations, wherein each configuration of the plurality of configurations includes a respective set of simulation parameters; and provide, to the machine learning network, training data generated in response to simulating the circuit design according to the plurality of configurations. In some aspects, the machine learning network identifies, in response to processing the training data, that a frequency associated with satisfying the target set of functional coverage statements is less than the target frequency.

Any of the aspects herein, wherein the instructions are further executable by the processor to: provide, to the machine learning network, training data generated based on simulations of the circuit design according to a plurality of configurations. In some aspects, each configuration of the plurality of configurations includes a respective set of simulation parameters. In some aspects, the machine learning network learns candidate combinations of the simulation parameters in response to processing the training data, wherein each candidate combination is associated with satisfying a functional coverage statement associated with the circuit design.

Any of the aspects herein, wherein the target functional coverage statement corresponds to a target code depth associated with the circuit design.

A system for tuning a set of simulation parameters associated with a design verification environment by: simulating a circuit design according to a set of simulation parameters;

providing, to a machine learning network, an indication of functional coverage results associated with simulating the circuit design according to the set of simulation parameters; receiving an output in response to the machine learning network processing the functional coverage results; and simulating the circuit design based on a recommended set of simulation parameters, wherein simulating the circuit design based on the recommended set of simulation parameters includes generating a set of component signals associated with satisfying a target functional coverage statement. In some aspects, the output includes: the target functional coverage statement associated with the circuit design; and the recommended set of the simulation parameters.

Any of the aspects herein, wherein: the set of simulation parameters are provided by the machine learning network; and the instructions are further executable by the processor to provide training data to the machine learning network based on the functional coverage results, wherein providing the training data includes providing positive reinforcement, negative reinforcement, or both with respect to the set of simulation parameters and the functional coverage results.

Any of the aspects herein, wherein the machine learning network includes a reinforcement learning network.

Any of the aspects herein, wherein values of the set of simulation parameters are selected by the machine learning network as having a highest reward among candidate values of the set of simulation parameters.

A method including: simulating a circuit design according to a set of simulation parameters; providing, to a machine learning network, an indication of functional coverage results associated with simulating the circuit design according to the set of simulation parameters; receiving an output in response to the machine learning network processing the functional coverage results; and simulating the circuit design based on a recommended set of simulation parameters, wherein simulating the circuit design based on the recommended set of simulation parameters includes generating a set of component signals associated with satisfying a target functional coverage statement. In some aspects, the output includes: the target functional coverage statement associated with the circuit design; and the recommended set of the simulation parameters.

Any aspect in combination with any one or more other aspects.

Any one or more of the features disclosed herein.

Any one or more of the features as substantially disclosed herein.

Any one or more of the features as substantially disclosed herein in combination with any one or more other features as substantially disclosed herein.

Any one of the aspects/features/implementations in combination with any one or more other aspects/features/implementations.

Use of any one or more of the aspects or features as disclosed herein.

It is to be appreciated that any feature described herein can be claimed in combination with any other feature(s) as described herein, regardless of whether the features come from the same described implementation.

The details of one or more aspects of the disclosure are set forth in the accompanying drawings and the description below. Other features, objects, and advantages of the techniques described in this disclosure will be apparent from the description and drawings, and from the claims.

The preceding is a simplified summary of the disclosure to provide an understanding of some aspects of the disclosure. This summary is neither an extensive nor exhaustive overview of the disclosure and its various aspects, implementations, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, implementations, and configurations of the disclosure are possible utilizing, alone or in combination, one or more of the features set forth above or described in detail below.

Numerous additional features and advantages of the present disclosure will become apparent to those skilled in the art upon consideration of the implementation descriptions provided hereinbelow.

DETAILED DESCRIPTION

Figure 1:
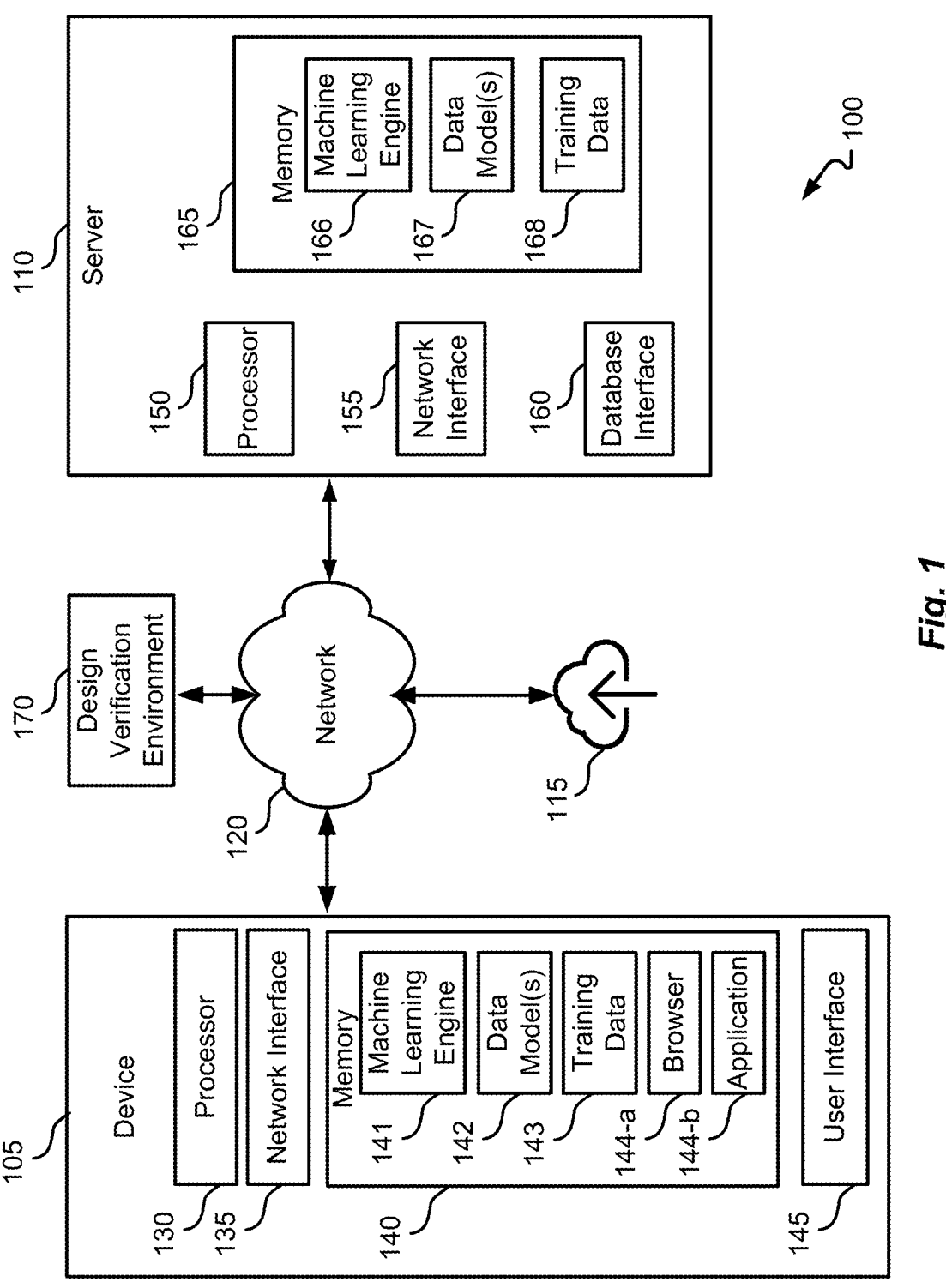
FIG. 1 illustrates an example of a system in accordance with aspects of the present disclosure.

The present disclosure is directed to using of machine learning (ML), particularly reinforcement learning (RL) algorithms using a deep neural network (DNN), to generate the stimuli needed to achieve functional coverage in integrated circuit design, including rare corner cases. The combination of RL with a DNN is called deep reinforcement learning (deep RL). The use of deep RL will be to create stimuli which are more targeted and more efficient than simple random stimulus testing.

In one embodiment, Deep RL tunes a simulation environment that tests the integrated circuit design by one or more of: (i) adjusting verification parameters to adjust input conditions (for example generating more of a particular type of transaction or series of transactions which are more likely to lead to the particular case of interest); (ii) adjusting verification responses to design outputs (for example delaying or speeding up simulation environment responses to design requests for data); and/or modifying configuration parameters of the design (for example enabling or disabling design modes or features which may influence how likely certain internal conditions are to occur).

Various embodiments described herein support using deep learning to improve design verification by optimizing code coverage, functional coverage, and bug detection.

Design verification of integrated circuits may involve generating a stimulus of input signals and then evaluating the resulting output signals against expected values. Such stimulus generation and evaluation of output signals allows design simulations to be conducted to determine whether a design is operating correctly. Simulation failures indicate that one or more bugs are present in the design. Some techniques include modifying the design in order to fix the bug and re-running the simulation(s) to verify the fix and/or uncover more bugs.

However, a design passing a fixed set of simulations is insufficient to demonstrate that the design is free from bugs. For example, verification of the design may include determining whether the set of simulations run on the design are sufficient to fully cover the entirety of the functionality of the design associated with satisfying design objectives. The extent to which a set of simulations covers desired design functionality is termed coverage, and a number of different methods by which coverage can be measured and tracked are described herein.

An existing method for tracking coverage involves determining whether each line of code in a design evaluates both to a '1' and to a '0' at least once each during a set of simulations. However, this method can be insufficient for guaranteeing full coverage, as there may be conditions which are deemed necessary for the design to handle for which there may not be a corresponding line of code which exactly encapsulates the condition. Some examples include cases in which there may be a confluence of two or more conditions which can occur in the same cycle (e.g., clock cycle). Each condition may have a corresponding line of code, but there may not be a line of code which fully expresses all conditions occurring simultaneously.

In order to handle these cases, some techniques include encapsulating a functional condition involving a number of existing signals in the design in a functional coverage statement. Each functional coverage statement may represent a condition which the design must be able to handle functionally but for which no signal is already present in the design. Many such functional coverage statements may be written in order to capture cases which the design must be able to handle. The set of functional simulations run on the design must then be able to ensure that all functional coverage statements are satisfied (e.g., hit) at least once during the set of simulations. Of particular importance are so-called "corner cases," which represent hard-to-hit cases.

As IC designs have become increasingly complex, the list of functional coverage statements for evaluating such IC designs has become significantly large. Moreover, with increasing complexity of the IC designs, many of the functional coverage statements represent conditions which occur very rarely in simulation. For example, if a functional coverage statement represents a set of unrelated events to all occur together in the same clock cycle, and each of the events is itself rarely hit in simulation, the resulting functional coverage statement will be exceedingly rare.

Since all functional coverage statements must be "hit" in order to ensure complete verification coverage of the design, each functional coverage statement which is not hit must be analyzed in order to determine why it was not hit. Some techniques include tuning the simulation input parameters in order to improve the chances of hitting the coverage statement condition, and further, re-running the set of simulations. Such approaches can be relatively difficult and time consuming, as the approaches may involve significant verification team resources, which can delay the completion of design verification. In some cases, such approaches can increase the possibility of taping out a design with an undiscovered bug since generating large numbers of difficult to hit cases increases the chances of hitting a rare design bug prior to tapeout of the design.

Examples that support using deep learning to improve design verification by optimizing code coverage, functional coverage, and bug detection are described herein.

Aspects of the disclosure are further illustrated by and described with reference to apparatus diagrams, system diagrams, and flowcharts that relate to using deep learning to improve design verification by optimizing code coverage, functional coverage, and bug detection.

FIG. 1 illustrates an example of a system 100 in accordance with aspects of the present disclosure. The system 100 may include a device 105, a server 110, a database 115, a communication network 120, and a design verification environment 170. The devices 105, the server 110, the database 115, the communications network 120, and the design verification environment 170 may implement aspects of the present disclosure described herein. The device 105 may implement aspects of the techniques and features (e.g., machine learning algorithms (deep RL algorithms), design verification steering and optimization, near miss tracking, etc.) described herein.

In various aspects, settings of the any of the device 105, the server 110, database 115, and the network 120 may be configured and modified by any user and/or administrator of the system 100. Settings may include thresholds or parameters described herein, as well as settings related to how data is managed. Settings may be configured to be personalized for one or more devices 105, users of the devices 105, and/or other groups of entities, and may be referred to herein as profile settings, user settings, or organization settings. In some aspects, rules and settings may be used in addition to, or instead of, parameters or thresholds described herein. In some examples, the rules and/or settings may be personalized by a user and/or administrator for any variable, threshold, user (user profile), device 105, entity (e.g., patient), or groups thereof.

A device 105 may include a processor 130, a network interface 135, a memory 140, and a user interface 145. In some examples, components of the device 105 (e.g., processor 130, network interface 135, memory 140, user interface 145) may communicate over a system bus (e.g., control busses, address busses, data busses) included in the device 105. In some cases, the device 105 may be referred to as a computing resource.

In some cases, the device 105 may transmit or receive packets to one or more other devices (e.g., another device 105, the server 110, the database 115, the design verification environment 170) via the communication network 120, using the network interface 135. The network interface 135 may include, for example, any combination of network interface cards (NICs), network ports, associated drivers, or the like. Communications between components (e.g., processor 130, memory 140) of the device 105 and one or more other devices (e.g., another device 105, the database 115) connected to the communication network 120 may, for example, flow through the network interface 135.

The processor 130 may correspond to one or many computer processing devices. For example, the processor 130 may include a silicon chip, such as a FPGA, an ASIC, any other type of IC chip, a collection of IC chips, or the like. In some aspects, the processors may include a microprocessor, CPU, a GPU, or plurality of microprocessors configured to execute the instructions sets stored in a corresponding memory (e.g., memory 140 of the device 105). For example, upon executing the instruction sets stored in memory 140, the processor 130 may enable or perform one or more functions of the device 105.

The processor 130 may utilize data stored in the memory 140 as a neural network (also referred to herein as a machine learning network). The neural network may include a machine learning architecture. In some aspects, the neural network may be or include an artificial neural network (ANN). In some other aspects, the neural network may be or include any machine learning network such as, for example, a deep learning network, a convolutional neural network, or the like. Some elements stored in memory 140 may be described as or referred to as instructions or instruction sets, and some functions of the device 105 may be implemented using machine learning techniques.

The memory 140 may include one or multiple computer memory devices. The memory 140 may include, for example, Random Access Memory (RAM) devices, Read Only Memory (ROM) devices, flash memory devices, magnetic disk storage media, optical storage media, solid state storage devices, core memory, buffer memory devices, combinations thereof, and the like. The memory 140, in some examples, may correspond to a computer readable storage media. In some aspects, the memory 140 may be internal or external to the device 105.

The memory 140 may be configured to store instruction sets, neural networks, and other data structures (e.g., depicted herein) in addition to temporarily storing data for the processor 130 to execute various types of routines or functions. For example, the memory 140 may be configured to store program instructions (instruction sets) that are executable by the processor 130 and provide functionality of machine learning engine 141 described herein. The memory 140 may also be configured to store data or information that is useable or capable of being called by the instructions stored in memory 140. One example of data that may be stored in memory 140 for use by components thereof is a data model(s) 142 (also referred to herein as a neural network model) and/or training data 143 (also referred to herein as a training data and feedback).

The machine learning engine 141 may include a single or multiple engines. The device 105 (e.g., the machine learning engine 141) may utilize one or more data models 142 for recognizing and processing information obtained from other devices 105, the server 110, the database 115, and the design verification environment 170. In some aspects, the device 105 (e.g., the machine learning engine 141) may update one or more data models 142 based on learned information included in the training data 143. In some aspects, the machine learning engine 141 and the data models 142 may support forward learning based on the training data 143. The machine learning engine 141 and data models 142 may support reinforcement learning (e.g., deep reinforcement learning) and imitation learning described herein. The machine learning engine 141 may have access to and use one or more data models 142. For example, the data model(s) 142 may be built and updated by the machine learning engine 141 based on the training data 143. The data model(s) 142 may be provided in any number of formats or forms.

Non limiting examples of the data model(s) 142 include Decision Trees, Support Vector Machines (SVMs), Nearest Neighbor, and/or Bayesian classifiers.

The machine learning engine 141 may create, select, and execute processing decisions as described herein. Processing decisions may be handled automatically by the machine learning engine 105, with or without human input.

The machine learning engine 141 may store, in the memory 140 (e.g., in a database included in the memory 140), historical information. Data within the database of the memory 140 may be updated, revised, edited, or deleted by the machine learning engine 141. In some aspects, the machine learning engine 141 may support continuous, periodic, and/or batch fetching of data and data aggregation.

The device 105 may render a presentation (e.g., visually, audibly, using haptic feedback, etc.) of an application 144 (e.g., a browser application 144 *a*, an application 144 *b*). The application 144 *b* may be an application associated with executing, controlling, and/or monitoring the design verification environment 170 described herein. For example, the application 144 *b* may enable control of the device 105 or the design verification environment 170.

In an example, the device 105 may render the presentation via the user interface 145. The user interface 145 may include, for example, a display (e.g., a touchscreen display), an audio output device (e.g., a speaker, a headphone connector), or any combination thereof. In some aspects, the applications 144 may be stored on the memory 140. In some cases, the applications 144 may include cloud based applications or server based applications (e.g., supported and/or hosted by the database 115 or the server 110). Settings of the user interface 145 may be partially or entirely customizable and may be managed by one or more users, by automatic processing, and/or by artificial intelligence.

In an example, any of the applications 144 (e.g., browser application 144-*a*, application 144-*b*) may be configured to receive data in an electronic format and present content of data via the user interface 145. For example, the applications 144 may receive data from another device 105, the server 110, or the design verification environment 170 via the communications network 120, and the device 105 may display the content via the user interface 145.

The database 115 may include a relational database, a centralized database, a distributed database, an operational database, a hierarchical database, a network database, an object oriented database, a graph database, a NoSQL (nonrelational) database, etc. In some aspects, the database 115 may store and provide access to, for example, any of the stored data described herein.

The server 110 may include a processor 150, a network interface 155, database interface instructions 160, and a memory 165. In some examples, components of the server 110 (e.g., processor 150, network interface 155, database interface 160, memory 165) may communicate over a system bus (e.g., control busses, address busses, data busses) included in the server 110. The processor 150, network interface 155, and memory 165 of the server 110 may include examples of aspects of the processor 130, network interface 135, and memory 140 of the device 105 described herein.

For example, the processor 150 may be configured to execute instruction sets stored in memory 165, upon which the processor 150 may enable or perform one or more functions of the server 110. In some aspects, the processor 150 may utilize data stored in the memory 165 as a neural network. In some examples, the server 110 may transmit or receive packets to one or more other devices (e.g., a device 105, the database 115, another server 110) via the communication network 120, using the network interface 155. Communications between components (e.g., processor 150, memory 165) of the server 110 and one or more other devices (e.g., a device 105, the database 115, the design verification environment 170, etc.) connected to the communication network 120 may, for example, flow through the network interface 155.

In some examples, the database interface instructions 160 (also referred to herein as database interface 160), when executed by the processor 150, may enable the server 110 to send data to and receive data from the database 115. For example, the database interface instructions 160, when executed by the processor 150, may enable the server 110 to generate database queries, provide one or more interfaces for system administrators to define database queries, transmit database queries to one or more databases (e.g., database 115), receive responses to database queries, access data associated with the database queries, and format responses received from the databases for processing by other components of the server 110.

The memory 165 may be configured to store instruction sets, neural networks, and other data structures (e.g., depicted herein) in addition to temporarily storing data for the processor 150 to execute various types of routines or functions. For example, the memory 165 may be configured to store program instructions (instruction sets) that are executable by the processor 150 and provide functionality of the machine learning engine 166 described herein. One example of data that may be stored in memory 165 for use by components thereof is a data model(s) 163 (also referred to herein as a neural network model) and/or training data 168. The data model(s) 163 and the training data 168 may include examples of aspects of the data model(s) 142 and the training data 143 described with reference to the device 105. For example, the server 110 (e.g., the machine learning engine 166) may utilize one or more data models 163 for recognizing and processing information obtained from devices 105, another server 110, the database 115, or the design verification environment 170. In some aspects, the server 110 (e.g., the machine learning engine 166) may update one or more data models 163 based on learned information included in the training data 168.

In some aspects, components of the machine learning engine 166 may be provided in a separate machine learning engine in communication with the server 110.

Aspects of the present disclosure support multiple types of tuning in a simulation environment. In an example associated with deep RL described herein, tuning of the simulation environment in order to make a rare condition more likely to be hit may include the following: 1) Adjusting verification parameters in order to adjust input conditions, 2) Adjusting verification responses to design outputs, and 3) Modifying configuration parameters of the design, example aspects of which are described herein.

1) Adjusting verification parameters in order to adjust input conditions—For example, generating more of a particular type of transaction or series of transactions which are more likely to lead to a particular case of interest. An example for this case is to try to create test stimuli which fill up the queues for a CPU or multiple CPUs in a chip.

Figure 2:
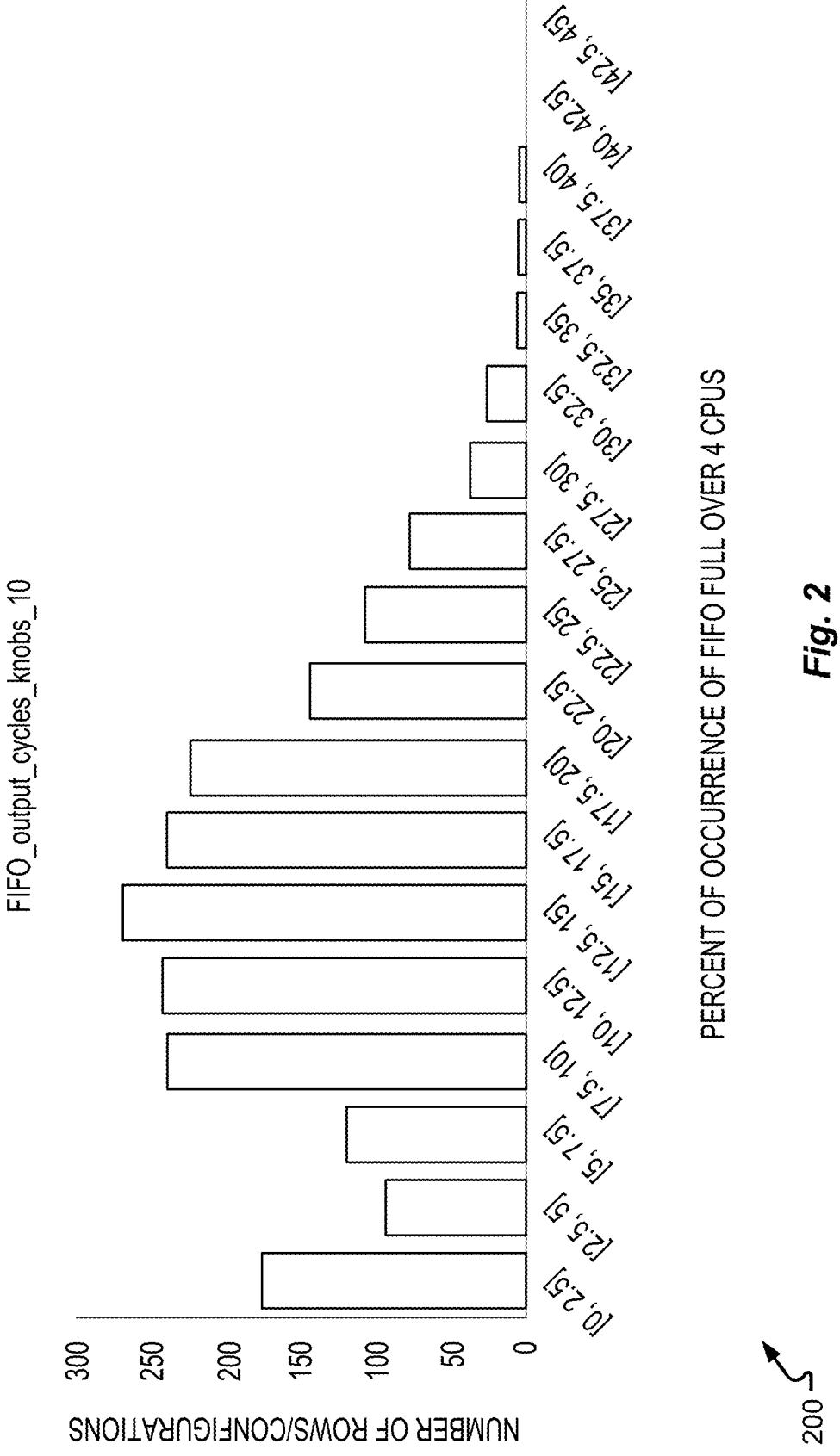
FIG. 2 is an example of resulting test outputs in accordance with aspects of the present disclosure.

Example results are illustrated in the chart illustrated at FIG. 2. For example, FIG. 2 is an example of resulting test outputs for attempting to fill up CPU queues using the techniques described herein.

2) Adjusting verification responses to design outputs—For example, delaying or speeding up simulation environment responses to design requests for data. Such delaying or speeding up of simulation environment responses can be illustrated by a MESI cache protocol example provided by Soren, D., et al., "A Primer on Memory Consistency & Cache Coherence," Morgan & Claypool, 2011 ("Soren") in which the GetM signals from one CPU interfere with the GetS signals from another CPU. This contention for the same cache line results in a bus pathology called Livelock.

An example of Livelock occurring within a vulnerability time-window using a Snoop protocol is illustrated in the following Table 1:

TABLE 1

Sequence of MESI instructions showing a
Livelock example described by Soren

| Cycle | Block B Events | Core C1's state for B |
|---|---|---|
| 0 | Initial state | I |
| 1 | Load request, issue GetS to bus | $IS^{AD}$ |
| 2 | Observe own GetS on bus | $IS^D$ |
| 3 | Observe other GetM on bus | $IS^D$ I |
| 4 | Receive data for own GetS | I |
| 5 | Re-issue GetS on bus | $IS^{AD}$ |
| 6 | Observe own GetS on bus | $IS^D$ |
| 7 | Observe other GetM on bus | $IS^D$ I |
| 8 | Receive data for own GetS | I |
| 9 | Never complete the load | |

3) Modifying configuration parameters of the design—For example enabling or disabling design modes or features which may influence how likely certain internal conditions are to occur.

Machine Learning to Steer the Design Verification Environment

According to example aspects of the present disclosure, techniques described herein may use a machine learning algorithm to steer the design verification environment. In some aspects, using machine learning (e.g., deep RL described herein) can greatly improve the achievement of full coverage in such cases of design verification. For example, aspects of the present disclosure support providing a mechanism by which coverage may be tracked. The mechanism may support using the degree of coverage attained in each set of simulations run to learn which sets of parameters (e.g., adjusting verification parameters, adjusting verification responses, modifying configuration parameters, etc.) are useful in hitting each coverage condition.

An example implementation is described in accordance with aspects of the present disclosure.

A set of simulations is run on the design in which simulation and/or design parameters which may be expected to influence coverage are varied. Examples of such parameters are included herein.

For each individual simulation run, the following set of verification input data is captured: verification parameters controlling input parameters; verification environment parameters; design configuration parameters; and coverage results. The coverage results may include a listing of all functional coverage statements and whether each one was hit or not during the simulation.

The results from all simulations are then run through a machine learning model implemented at a system (e.g., system 100 described with reference to FIG. 1) supported by the present disclosure. The machine learning model may implement a machine learning algorithm which tracks coverage results as a function of verification input data.

Over a series of simulations, the machine learning algorithm (e.g., deep RL algorithm) learns which combinations of sub-sets of verification input data are associated with hitting each functional coverage statement (e.g., which combinations of subsets of verification input data are required in order to hit each functional coverage statement). Aspects of the present disclosure support filtering the list of functional coverage statements tracked by the machine learning algorithm (e.g., deep RL algorithm) to exclude functional coverage statements which are hit frequently. In some aspects, by excluding such functional coverage statements, the machine learning algorithm may focus on cases which are relatively rare (e.g., extremely rare) and difficult to hit.

Once trained, the machine learning algorithm (e.g., deep RL algorithm) may generate a set of verification input data recommendations (e.g., new set of knobs) which will increase the chances of hitting functional coverage statements.

Near Miss Tracking for Hard to Hit Cases

Aspects of the present disclosure supportive of near miss tracking for hard to hit cases are described herein.

The example algorithm described in the prior section with respect to machine learning to steer the design verification environment may rely on an assumption that all functional coverage statements will be hit at some point over a sufficiently large number of set of simulation runs. For example, aspects of using deep RL described herein may support steering the design verification environment such that the functional coverage statements are hit more often (e.g., above a frequency threshold). In some aspects, using deep RL described herein may ensure that the functional coverage statements are hit more often, even for quite rare events (e.g., rare and difficult to hit cases described herein) when multiple simulation runs are run regularly (e.g. each night, each week, etc.) over a relatively long timeframe (e.g. several weeks, several months, etc.).

However, in some cases, a functional coverage statement may represent the confluence of events which themselves are so rare that the chances of all the events occurring in the same cycle are vanishingly small. As a result of such low chances of occurrence, all the events may not occur over the duration of a typical design project even with a rigorous verification environment with an extensive dedicated server farm.

Aspects of the deep RL approaches described herein may be used to greatly increase the chances of hitting rare functional coverage statements, which may thereby accelerate the process by which a design is deemed fully verified as well as increase the probability that hard to hit bugs will be uncovered earlier in the design process.

In an example, the deep RL algorithm described herein may be extended in order to track "near misses" (also referred to herein as "near miss events") where a particular functional coverage statement represented by the logical AND of a number of signals is never or very rarely (e.g., below a threshold quantity with respect to a temporal period) hit but for which the individual terms in the logical AND'ed list of signals are hit. Such an example condition may be termed a "near miss." In some aspects, the near miss event may be associated with a failure to simultaneously generate all component signals and thereby trigger the functional coverage statement represented by the logical AND.

In some cases, in addition to tracking the list of functional coverage statements, the machine learning algorithm (e.g., deep RL algorithm) may identify hard to hit functional coverage statements. The term "hard to hit" functional coverage statements described herein may include "near miss" cases and rare and difficult to hit cases described herein. The machine learning algorithm may expand the identified statements and track, from the expanded statements, any component signals which may be logical AND' ed together. The machine learning algorithm may track the component signals as described herein.

It is to be understood that aspects of the features associated with a machine learning algorithm or deep RL algorithm described herein may be implemented by a system (e.g., system 100 described with reference to FIG. 1), a device (e.g., device 105), a machine learning engine (e.g., machine learning engine 141, machine learning engine 166), and/or data model (e.g., data model 142, data model 167).

Aspects of the present disclosure support one or more training iterations using the techniques described herein with respect to tracking the list of functional coverage statements, identifying hard to hit functional coverage statements, expanding the identified statements, and tracking component signals. Aspects of the present disclosure support training which may result in the component signals of the hard to hit functional coverage statements being hit more frequently as the machine learning algorithm adjusts the verification input data. The result will be a greatly increased likelihood (e.g., above a threshold probability) of hitting the very rare full functional coverage statement in subsequent verification runs.

In an example, for each "near miss" signal (e.g., very hard to hit signals which are rarely if ever hit), the machine learning algorithm may be extended as follows. The machine learning algorithm may identify "near miss" signals (e.g., signals which are rarely if ever hit) based on coverage results associated with the signals over a number of simulation runs. For each of the identified "near miss" signals (e.g., rarely hit signals), the machine learning algorithm may parse an abstraction (e.g., RTL or some other suitable design specification such as, for example, a netlist) of the design in order to determine the component signals on which the "near miss" signal is dependent. The machine learning algorithm (e.g., deep RL algorithm) may track and optimize the coverage of the component signals using techniques as described herein.

Aspects of the present disclosure support one or more training iterations using the techniques described herein with respect to the identifying of "near miss" signals, determining of the component signals on which the "near miss" signal is dependent, and the tracking and optimization of the coverage of the component signals. Aspects of the present disclosure support training which may result in the component signals of the hard to hit functional coverage statements being hit more frequently as the deep RL algorithm adjusts the verification input control signals to optimize coverage on the component signals. As the component signals are then hit more frequently, the result will be a greatly increased likelihood of hitting the very rare functional coverage signal in subsequent verification runs.

This bootstrapping approach is based on the observation in Kuhn, R., et. al., "Practical Combinatorial Testing," NIST Special Publication 800-142, 2010 ("Kuhn") that a relatively small number of component interaction combinations cause almost all bugs. That is, for example, n should be relatively small (e.g., $n \leq 3$ in the majority of cases, and $n \leq 6$ for almost all cases). Aspects of the present disclosure support using the deep RL techniques described herein to learn from these multiple t-way combination cases to increase n-way AND coverage instances, where $t < n$, and where n=the number of signals in the AND coverage statement.

Aspects of the present disclosure support sufficient training which may result in the component signals of the hard to hit functional coverage statements being hit more frequently (e.g., above a threshold quantity with respect to a temporal period or quantity of iterations) as the deep RL algorithm adjusts the verification input data. As the functional coverage statements are hit more frequently, the result will be a greatly increased likelihood of hitting the very rare full functional coverage statement in subsequent verification runs.

Aspects of the deep RL techniques described herein include perturbation methods in the deep RL for the control knobs (e.g., as indicated in the figures) which create randomized test stimulus signals within a simulation subject to constraints specified by the control knobs. A particular approach for perturbation is within a reward predictor (e.g., illustrated at FIGS. 1 and 3), aspects of which are described herein.

Figure 3:
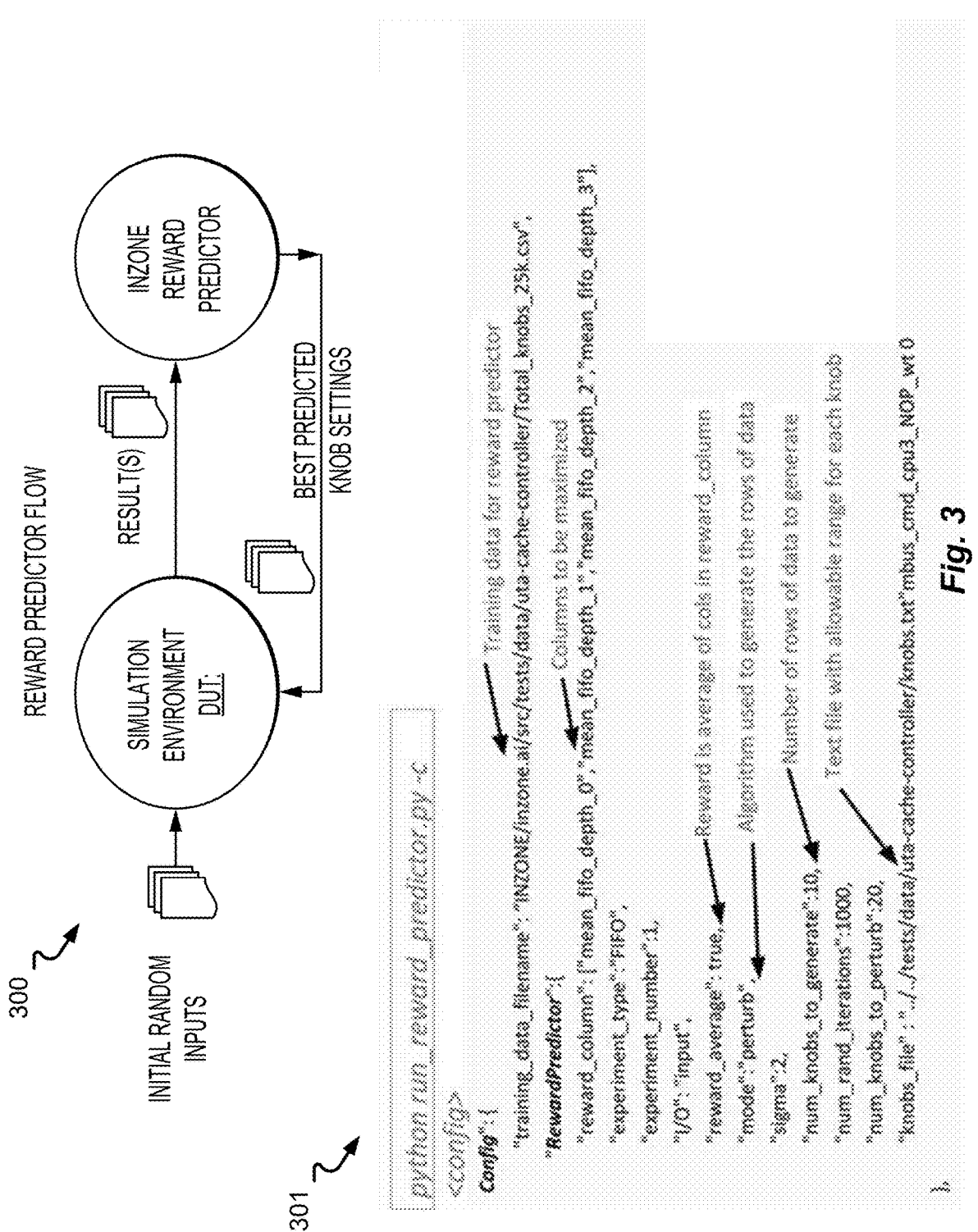
FIG. 3 illustrates an example of reward predictor usage in accordance with aspects of the present disclosure.

FIG. 3 illustrates an example of reward predictor usage supported by aspects of the deep RL algorithm of the present disclosure. For example, FIG. 3 illustrates an example reward predictor flow 300 and example code 301 associated with implementing the reward predictor flow 300. Aspects of the reward predictor flow 300 may be implemented by aspects of any reward predictor described herein.

Figure 4:
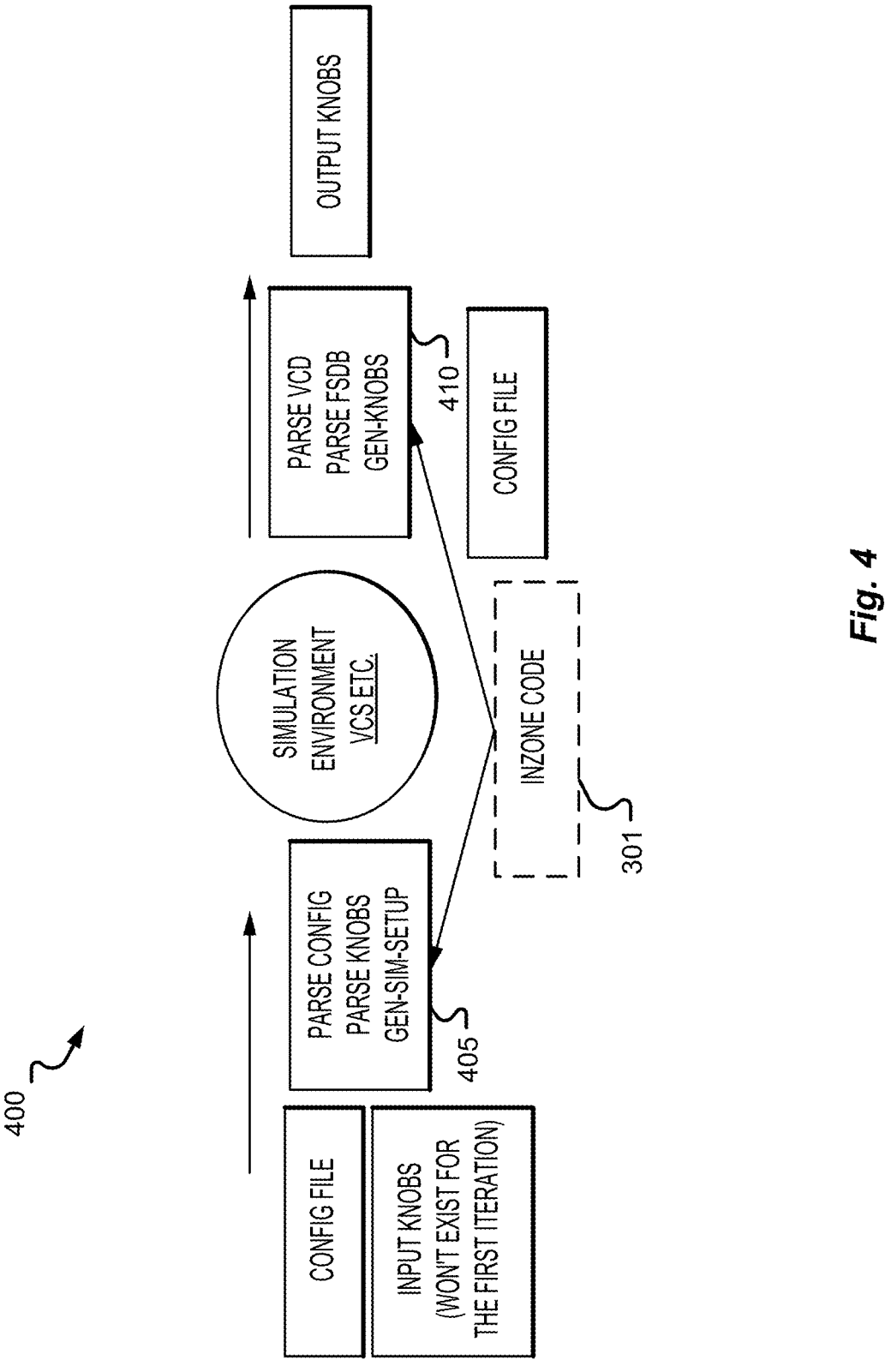
FIG. 4 illustrates an example process flow in accordance with aspects of the present disclosure.

FIG. 4 illustrates an example process flow 400 of the reward predictor. Aspects of the process flow 400 (e.g., 405 and 410) may be implemented by example code 301 of FIG. 3. Aspects of the reward prediction flow 400 may be implemented by aspects of any reward predictor described herein.

Example aspects of the reward predictor are described herein. The reward predictor is a tool which, given a dataset with a reward variable (also referred to herein as a reward) to be maximized, may recommend values for the features of the dataset. In an example, the reward predictor may recommend values for the features of the dataset based on a correlation between the features and the reward variable. For example, the reward predictor may recommend values for the features of the dataset for achieving the reward variable.

In an example use case, a company may have a sales dataset which has profiles of various customers and purchases made by the customers. The reward predictor may provide recommendations indicating characteristics of a target customer for which to direct marketing strategies. For example, the reward predictor may recommend what the profile of an ideal customer (e.g., highest sales) would look like in order to direct marketing strategies of the company toward the ideal customer.

The reward predictor may include multiple modes. In an example, the reward predictor may include two modes: random search and perturbation.

Random search: After fitting a function (model) between the features and the reward, the reward predictor may search the space of possible values of the features randomly. Of the random values of the features, the reward predictor may recommend those for which the model predicts to be the highest. For example, the reward predictor may recommend features (and corresponding values) for which the model predicts to have the highest reward.

Perturbation: After setting a range of exploration, the reward predictor may inspect the knobs (and knob settings) by adding noise (e.g., within the range of exploration) to the row of features which correspond to the highest actual values of rewards. The reward predictor may recommend, from among the row of features to which noise is added, features which have the highest reward predicted by the model.

In some aspects, a proposed modification of the perturbation (e.g., modified perturbation method later described herein), includes modifying the control knob settings within a simulation in order to successively bootstrap the capability of the simulation to reach increasingly harder-to-hit coverage goals.

Extension to Increase the Likelihood of Hitting Bugs

The techniques described herein support increasing the chances of discovering bugs earlier in a design cycle by increasing the chances of hitting functional coverage statements which are often identified by design/verification teams as being tricky cases to deal with or cases deemed to be interesting or unusual in some way (e.g., hard to hit cases, near miss cases, etc. as described herein). Increasing the chances of hitting such functional coverage statements has the effect of improving the richness and depth of design verification simulations by helping to steer the verification stimulus into increasingly obscure corners of the design, which may thereby uncover bugs relatively quickly compared to some other design verification techniques.

Aspects of the techniques described herein may be extended to directly target bugs by treating a simulation failure due to a bug in the same way as a functional coverage statement as described herein. For example, by treating the simulation failure due to a bug in the same way as a functional coverage statement, the machine learning algorithm may learn combinations of verification input data which result in the discovery of a design bug and thereby, over time, steer the design verification environment in ways which make discovery of further bugs more likely.

For example, the machine learning algorithms described herein may identify that a combination of particular design modes being enabled together with a particular design verification environment parameter causes a section of the design to be exercised more often. The design verification environment may steer simulations toward the section of the design, thereby increasing the chances of discovering a bug in the section of the design. That is, if that section of the design happens to be "buggy" (e.g., inclusive of a quantity or frequency of bugs above a threshold amount), then it will be more likely for a bug to be found if the design verification environment (using a machine learning algorithm described herein) steers simulations towards that section of the design. The machine learning algorithm may gradually improve the section of the design until bugs are no longer found (e.g., existing bugs are resolved), at which point the machine learning environment learns to steer the design verification environment in a different direction (e.g., towards another section of the design in which additional bugs may be identified and addressed).

Modified Perturbation Method

The following bootstrapping of knob settings is a modification of the perturbation techniques described herein.

In an example, presently we have histograms where queue depth is on the x-axis and the counts for reaching that queue depth in the simulations is on the y-axis. Each graph has been created by simulations according to a particular set of knob settings. Then for the set of all the knob settings which have been used, we have a set of such histograms.

The modified perturbation method may include the following:

For each queue depth $d_i$: i=1, . . . , 15 in the set of histograms, find the histogram which achieves the maximum # of counts $M_i$:i=1, . . . , 15 for depth $d_i$.

Find $$M_1^{max} = \underset{i}{\max}\{M_i\}.$$

Now $$M_1^{max}$$

corresponds to some queue depth $$j_1^{max}.$$

As illustrated above, a queue depth which has been reached the most (e.g., a quantity of times greater compared to other queue depths) may have a good probability (e.g., above a threshold) of being reached again.

Use the knob settings which achieved $$M_1^{max}$$

for queue depth $$j_1^{max}$$

and perform simulations until queue depth $$j_1^{max}$$

is reached.

At this point in the simulation, recursively repeat the process, with a target of reaching a queue depth with index greater than $$j_1^{max}.$$

In other words, define:

$$M_2^{max} = \underset{i > j_1^{max}}{\max}\{M_i\};$$

$$M_2^{max}$$

corresponds to index $$j_2^{max}.$$

To achieve this, find the knob settings which achieved $$M_2^{max},$$

and perform simulations until queue depth $$j_2^{max}$$

is reached.

Repeat until queue depth equal to 15 is reached.

In some example implementations, the modified perturbation method may include performing new reward shaping at each stage when the knob settings are changed.

It should be noted that the approach described herein with reference to the modified perturbation method critically assumes that a simulation can be stopped (or paused) when a previously specified queue depth has been reached, at which the simulation state can be saved, a change of knob settings be implemented, and the simulation can then be resumed.

Code Coverage Examples

An example of target conditions implemented using a deep RL algorithm described herein is provided below.

```
for i in range(num_iterations):
    depth = 0
    i,j,k = 0,0,0
    i = random.randint(1,100)
    if i is range(1,26):
        depth = 1
        j = random.randint(1,100)
        if j in range(26,51):
            depth = 2
            k = random.randint(1,100)
            if k in range(51,76):
                depth = 3
            else:
                depth = 2
                k = 0
        else:
            depth = 1
            j = 0
    else:
        depth = 0
        i = 0
```

Referring to the above example code, there are 3 levels in a nested 'if' condition. The deep RL algorithm supports flowing to lower depths only if the values of {i,j,k} satisfy a certain range constraint. Depth=3 is an example proxy for a hard to reach condition or state. Applying the deep RL algorithm supports training a neural network to learn to produce the best {i,j,k} values without exhaustive random combinations (also referred to herein as fuzzing).

In an example of results of applying the deep RL algorithm to a RL agent, the RL agent without any prior knowledge my learn (be trained) by trial and error that i should be in (1,25), j in (25,50), and kin (50,75).

Figure 5:
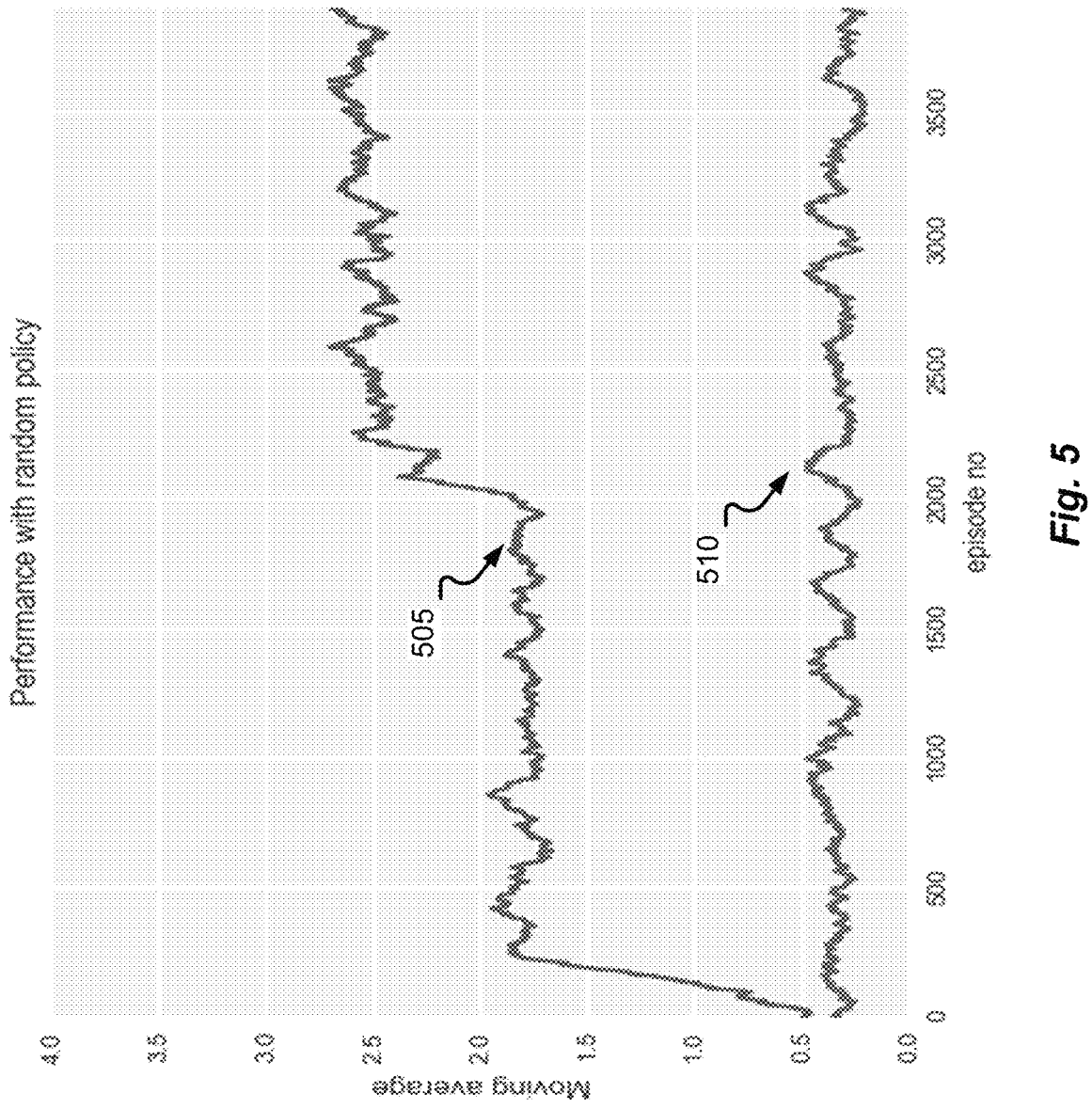
FIG. 5 is an example graph illustrating average code depth reached using a deep RL algorithm in accordance with aspects of the present disclosure.

FIG. 5 is an example graph 500 illustrating average code depth 505 reached using the deep RL algorithm described herein compared to average code depth 510 reached using other techniques.

Figure 6:
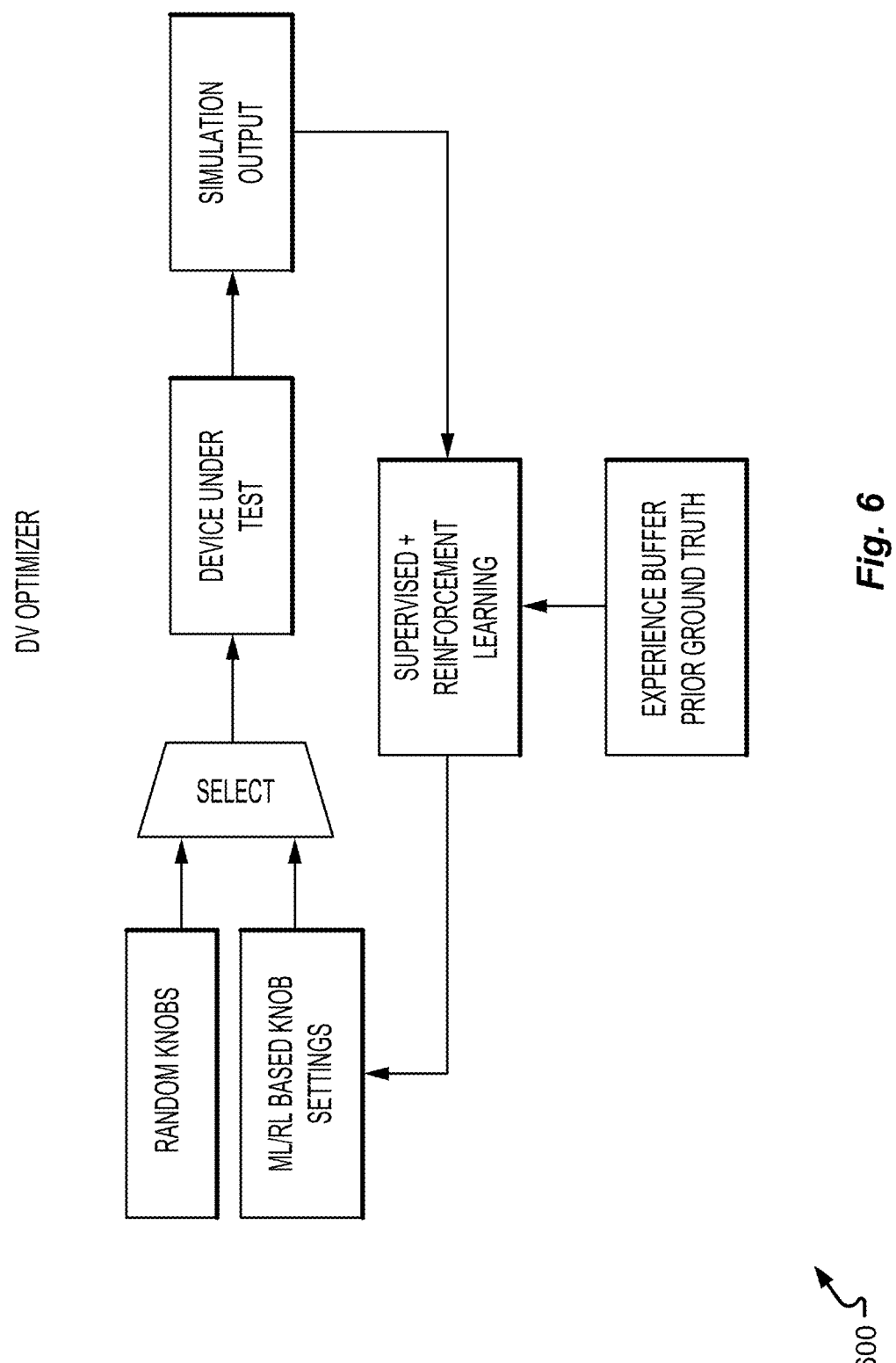
FIG. 6 illustrates an example block diagram of a design verification optimizer in accordance with aspects of the present disclosure.

FIG. 6 illustrates an example block diagram 600 of a design verification optimizer in accordance with aspects of the present disclosure. Block diagram 600 supports RL for design verification described herein. Aspects of RL for design verification in accordance with aspects of the present disclosure include:

Using RL to drive the input to a simulator with a set of controllable knobs (e.g., design verification controls, design configurations, +args, etc.).

Optimizing a given metric or multiple metrics (e.g., coverage, FIFO Depths, victim buffer count) that are correlated with (e.g., depend on) the settings of the knobs.

Modeled as Markov Decision Process (MDP).

Using a DQN (Deep Q-Network) to train an RL agent to explore the action space and learn the Q-values.

Pre-filling an experience buffer to speed up learning.

Figure 7:
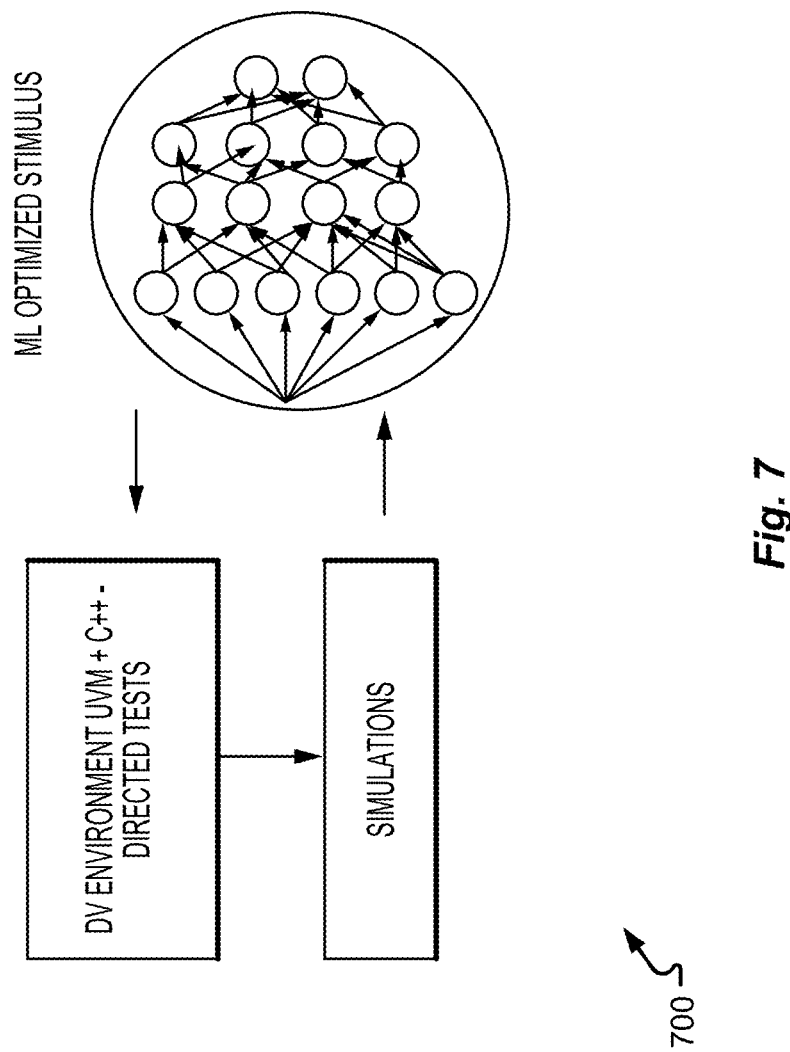
FIG. 7 illustrates an example diagram that supports a machine learning optimized stimulus in accordance with aspects of the present disclosure.

FIG. 7 illustrates an example diagram 700 that supports machine learning optimized stimulus in accordance with aspects of the present disclosure. As described herein, aspects of the present disclosure support optimization and scaling of a design verification environment with machine learning, which may provide higher coverage, exploration of new states, and increased speed in identifying bugs.

Figure 8:
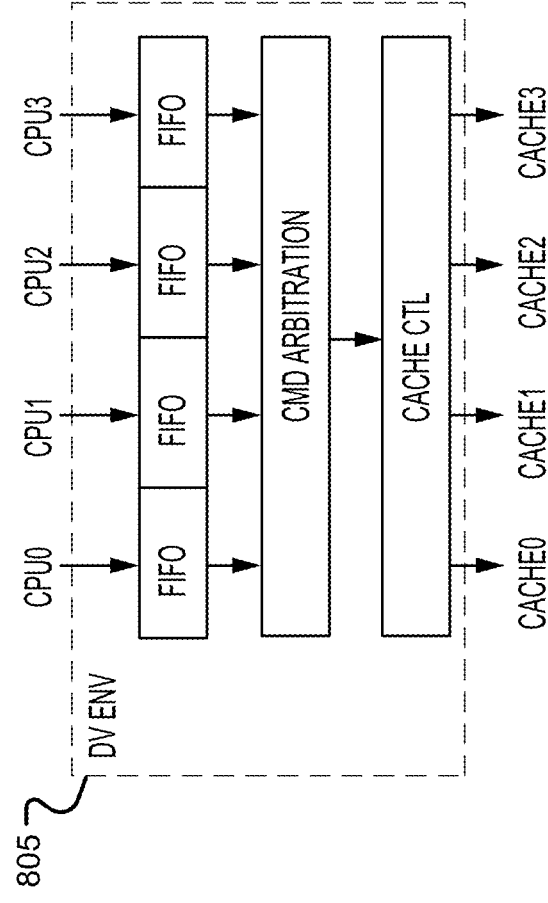
FIG. 8 illustrates an example of a design verification environment in accordance with aspects of the present disclosure.
Figure 8:
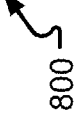

FIG. 8 illustrates an example 800 of a design verification environment 805 for which design verification optimization described herein may be applied.

Figure 9:
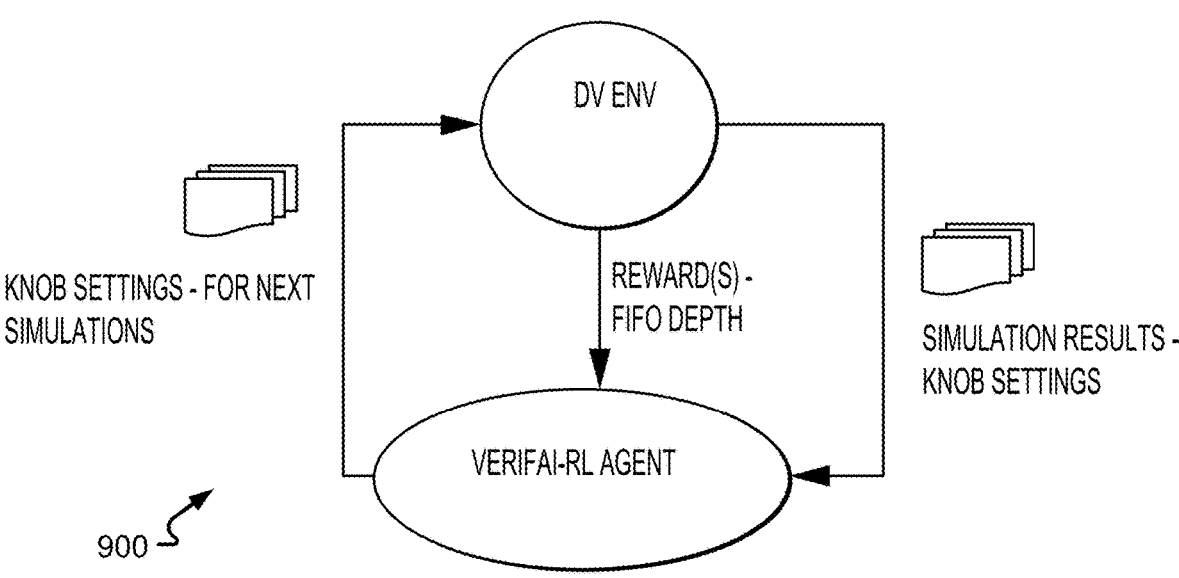
FIG. 9 illustrates an example design verification optimization flow in accordance with aspects of the present disclosure.
Figure 9:
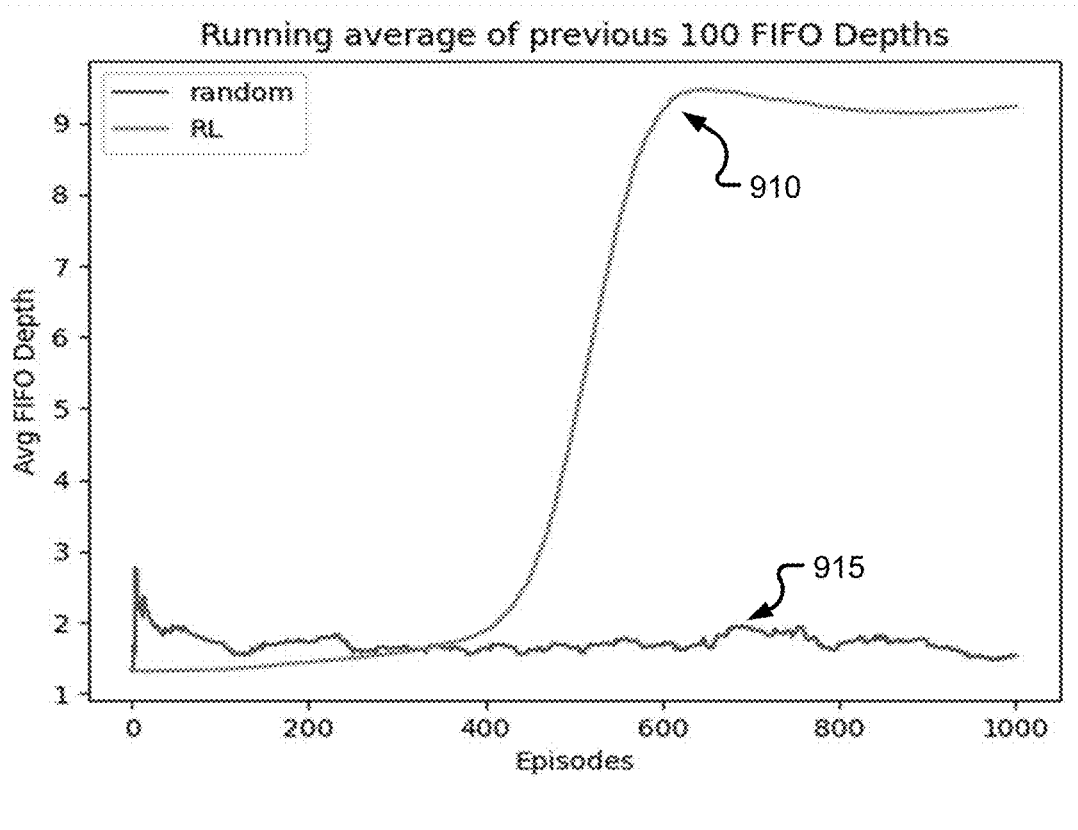

FIG. 9 illustrates an example design verification optimization flow 900 applied to the design verification environment 805 of FIG. 8. FIG. 9 further illustrates a graph 905 that plots average FIFO depth 910 as reached using the deep RL algorithm described herein and average FIFO depth 915 reached using other techniques.

With reference to FIGS. 8 and 9:

Target goal: Optimize the depth to which the FIFOs are filled.

Cache controller design: MESI_ISC_FIFO; process CPU commands; control for downstream caches.

DV controls/knobs: CPU command mix (Rd/Wr/NOP/BrdCast); CPU command addr ranges (tag, index, offset).

Design background: Commands are entered into FIFO when two or more incoming non-NOP requests are to the same address.

With reference to graph 905, the deep RL algorithm described herein may find trick (limit address range) on its own.

Figure 10:
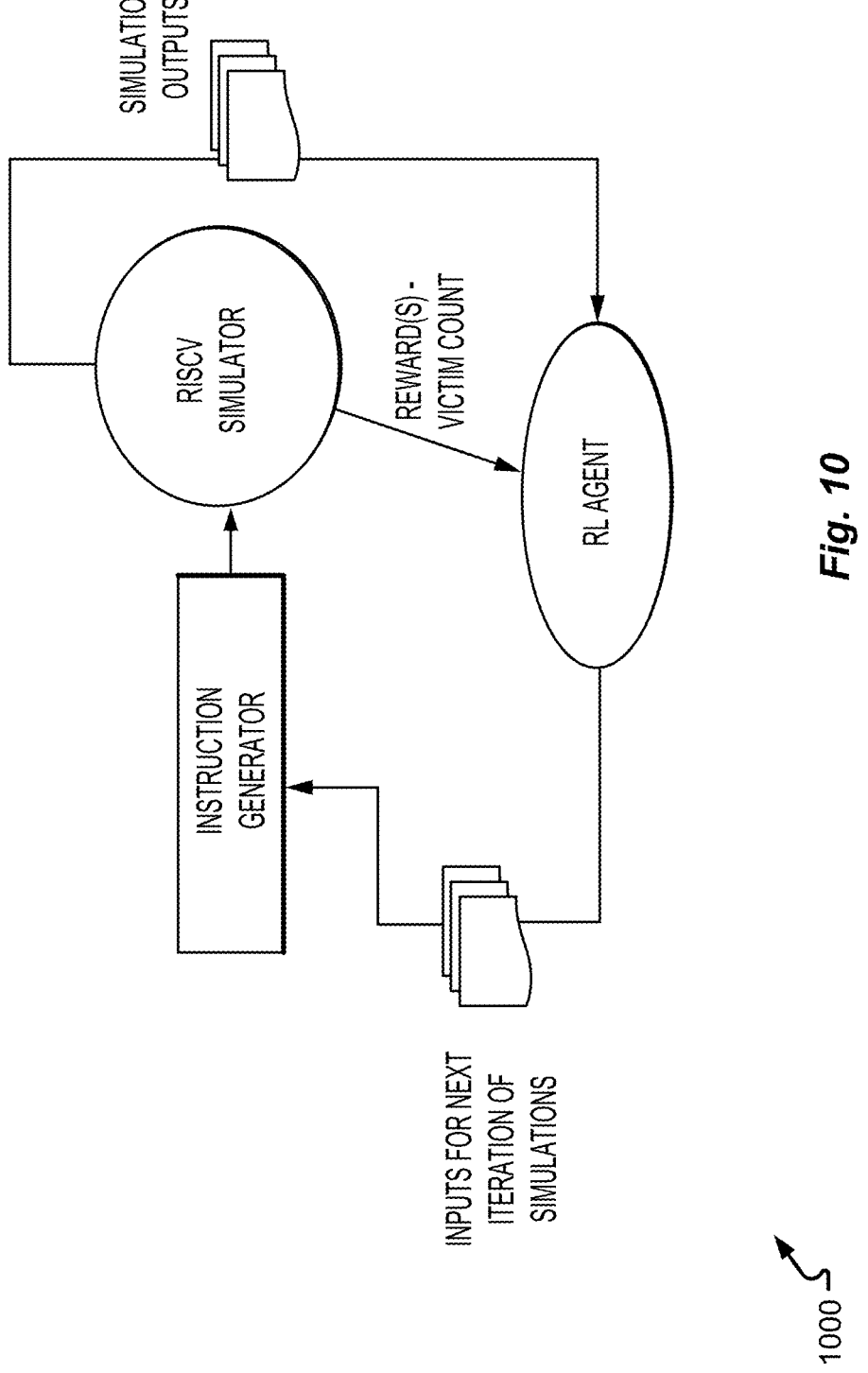
FIG. 10 illustrates an example design verification optimization flow in accordance with aspects of the present disclosure.

FIG. 10 illustrates an example design verification optimization flow 1000 applied to an RISC-V OpenSource design and verification environment (64-bit Ariane processor core; a random instruction sequence generator (IG); instruction generator controls/knobs; each iteration involves multiple simulations).

With reference to FIG. 10, the example target goal is to generate instructions sequences that will increase victim-buffer counts. For example, with reference to the design verification optimization flow 1000, a deep RL algorithm (e.g., implemented at an RL agent described herein) may learn each iteration (e.g., learn which knobs impact victim buffer count), adjust knob settings for the IG for the next iteration, and learn to generate settings which increase victim counts. Accordingly, for example, using the deep RL algorithm described herein, a higher average number of victims is achieved compared to simulations using random knobs (and/or knob values). The terms "victim count" and "victim buffer count" may be used interchangeably herein.

Figure 11:
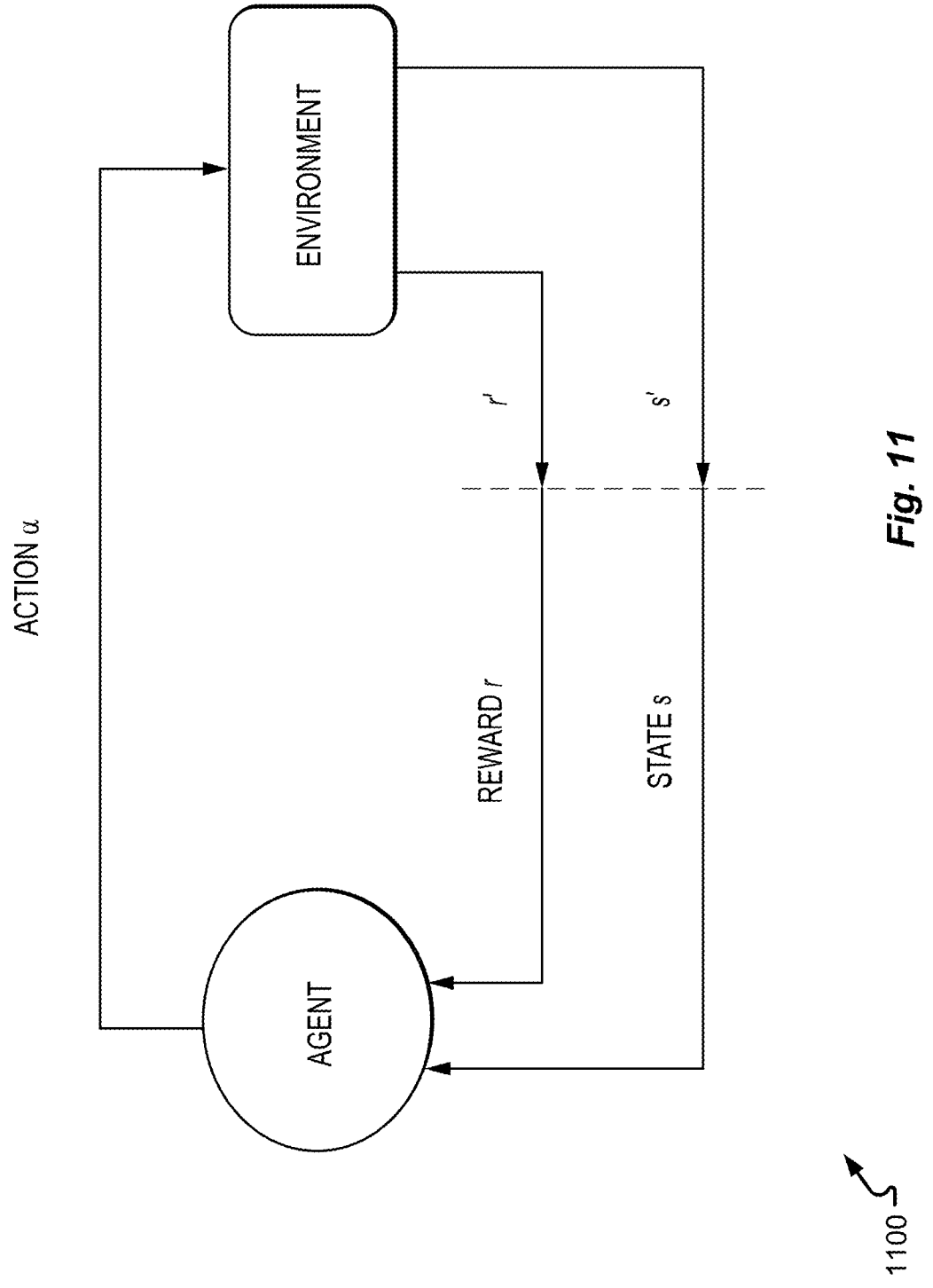
FIG. 11 illustrates an example of a code coverage problem setup in accordance with aspects of the present disclosure.

FIG. 11 illustrates an example 1100 of a code coverage problem setup (deep-Q-network (DQN)) in accordance with aspects of the present disclosure.

Q-Learning is a Reinforcement Learning Algorithm (RL)*. In Q-Learning the goal is to maximize the cumulative discounted reward which is given by the following Bellman Equation*:

$$q_\pi(s, a) = \mathbb{E}_\pi[R_{t+1} + \gamma q_\pi(S_{t+1}, A_{t+1}) \mid S_t = s, A_t = a]$$

With respect to the equation:

q=Expected Return or Value of estimated future cumulative reward

{St, At, Rt}={State, Action, Reward} at time t

For a given state s, and action a at time t, with the discount factor γ.

At the core of DQN are Q-value, where Q represents the discounted future rewards for a particular action from a particular state. DQN uses Deep Neural Networks (DNN) to estimate these Q-values when the state space becomes too large for simple lookup table approaches.

Figure 12:
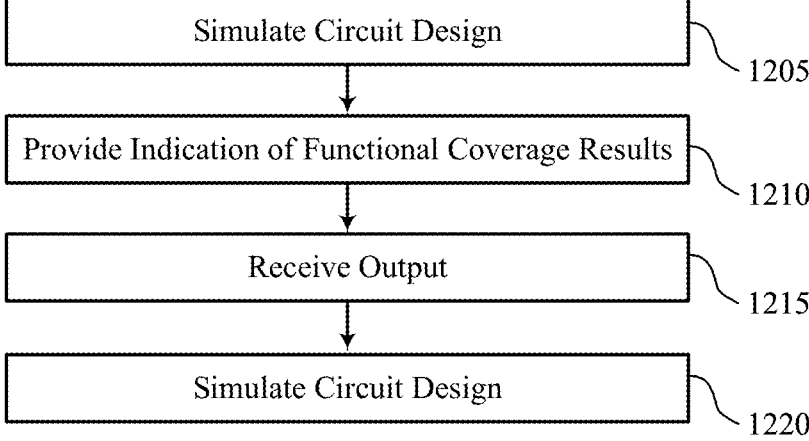
FIG. 12 illustrates an example process flow in accordance with aspects of the present disclosure.

FIG. 12 illustrates an example of a process flow 1200 that supports deep learning to improve design verification in accordance with aspects of the present disclosure.

In the following description of the process flow 1200, the operations may be performed in a different order than the order shown, or the operations may be performed in different orders or at different times. Certain operations may also be left out of the process flow 1200, or other operations may be added to the process flow 1200.

It is to be understood that while any device (e.g., a device 105, a server 110, etc. implementing a model trained using deep RL as described herein) may perform the operations shown.

At 1205, the process flow 1200 may include simulating a circuit design according to a set of simulation parameters.

At 1210, the process flow 1200 may include providing, to a machine learning network, an indication of functional coverage results associated with simulating the circuit design according to the set of simulation parameters.

At 1215, the process flow 1200 may include receiving an output in response to the machine learning network processing the functional coverage results, wherein the output includes: a target functional coverage statement associated with the circuit design; and a recommended set of the simulation parameters.

At 1220, the process flow 1200 may include simulating the circuit design based on the recommended set of simulation parameters, wherein simulating the circuit design based on the recommended set of simulation parameters includes generating a set of component signals associated with satisfying the target functional coverage statement.

In some aspects, the set of simulation parameters are provided by the machine learning network. In some aspects, the process flow 1200 may include providing training data to the machine learning network based on the functional coverage results, wherein providing the training data includes providing positive reinforcement, negative reinforcement, or both with respect to the set of simulation parameters and the functional coverage results.

In some aspects, the machine learning network includes a reinforcement learning network.

In some aspects, values of the set of simulation parameters are selected by the machine learning network as having a highest reward among candidate values of the set of simulation parameters. In some aspects, the candidate values are randomly selected by the machine learning network.

In some aspects, processing the functional coverage results by the machine learning network includes tracking the coverage results as a function of the set of simulation parameters.

In some aspects, the set of simulation parameters include: one or more input conditions associated with simulating the circuit design; and one or more verification parameters associated with setting the one or more input conditions.

In some aspects, the set of simulation parameters include one or more verification environment parameters.

In some aspects, the set of simulation parameters include one or more design configuration parameters.

In some aspects, the functional coverage results associated with simulating the circuit design according to the set of simulation parameters include an indication of a first quantity of functional coverage statements satisfied in response to the simulation. In some aspects, second functional coverage results associated with simulating the circuit design according to the recommended set of simulation parameters include an indication of a second quantity of the functional coverage statements satisfied in response to the simulation, wherein the second quantity is larger than the first quantity.

In some aspects, a result associated with simulating the circuit design based on the recommended set of simulation parameters includes an increased probability of satisfying the target functional coverage statement.

In some aspects, a result associated with simulating the circuit design based on the recommended set of simulation parameters includes achieving a target frequency associated with satisfying the target set of functional coverage statements associated with the circuit design.

In some aspects, the process flow 1200 may include simulating the circuit design according to a plurality of configurations, wherein each configuration of the plurality of configurations includes a respective set of simulation parameters; and providing, to the machine learning network, training data generated in response to simulating the circuit design according to the plurality of configurations. In some examples, the machine learning network identifies, in response to processing the training data, that a frequency associated with satisfying the target set of functional coverage statements is less than the target frequency.

In some aspects, the process flow 1200 may include providing, to the machine learning network, training data generated based on simulations of the circuit design according to a plurality of configurations, wherein each configuration of the plurality of configurations includes a respective set of simulation parameters. In some examples, the machine learning network learns candidate combinations of the simulation parameters in response to processing the training data, wherein each candidate combination is associated with satisfying a functional coverage statement associated with the circuit design.

In some aspects, the target functional coverage statement corresponds to a target code depth associated with the circuit design.

Any of the steps, functions, and operations discussed herein can be performed continuously and automatically.

The exemplary systems and methods of this disclosure have been described in relation to artificial intelligence. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Furthermore, while the exemplary embodiments illustrated herein show the various components of the system collocated, certain components of the system can be located remotely, at distant portions of a distributed network, such as a LAN and/or the Internet, or within a dedicated system. Thus, it should be appreciated, that the components of the system can be combined into one or more devices, such as a server, communication device, or collocated on a particular node of a distributed network, such as an analog and/or digital telecommunications network, a packet-switched network, or a circuit-switched network. It will be appreciated from the preceding description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire, and fiber optics, and may take the form of acoustic or light waves, such as those generated during radio-wave and infra-red data communications.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as a program embedded on a personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

The term "deep learning" refers to machine learning methods based on artificial neural networks. Learning can be supervised, semi-supervised, or unsupervised. Deep learning architectures include deep neural networks, deep belief networks, recurrent neural networks, and convolutional neural networks.

The term "machine learning algorithms" refers to algorithms that effectively perform a specific task without using explicit instructions, relying on patterns and inference instead. It is normally seen as a subset of artificial intelligence. Machine learning algorithms build a mathematical model based on sample data, known as "training data", to make predictions or decisions without being explicitly programmed to perform the task. Machine learning algorithms include, for example supervised and semi-supervised learning algorithms, unsupervised learning algorithms, and reinforcement learning algorithms.

The term "means" as used herein shall be given its broadest possible interpretation in accordance with 35 U.S.C., Section(s) 112(f) and/or 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary, brief description of the drawings, detailed description, abstract, and claims themselves.

The term "module" as used herein refers to any known or later developed hardware, software, firmware, artificial intelligence, fuzzy logic, or combination of hardware and software that is capable of performing the functionality associated with that element.

The term "reinforcement learning" refers to an area of machine learning concerned with how software agents ought to take actions in an environment so as to maximize some notion of cumulative reward. Reinforcement learning is considered as one of three machine learning paradigms, alongside supervised learning and unsupervised learning. It differs from supervised learning in that labelled input/output pairs need not be presented, and sub-optimal actions need not be explicitly corrected. Instead the focus is finding a balance between exploration (of uncharted territory) and exploitation (of current knowledge). The environment is typically formulated as a Markov decision process (MDP), as many reinforcement learning algorithms for this context utilize dynamic programming techniques. The main difference between the classical dynamic programming methods and reinforcement learning algorithms is that the latter do not assume knowledge of an exact mathematical model of the MDP and they target large MDPs where exact methods become infeasible.

Examples of the processors as described herein may include, but are not limited to, at least one of Qualcomm® Snapdragon® 800 and 801, Qualcomm® Snapdragon® 610 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

What is claimed is:

1. A system comprising:

a processor; and a memory storing instructions thereon that, when executed by the processor, cause the processor to:

simulate a circuit design according to a set of simulation parameters;

provide, to a machine learning network, an indication of functional coverage results associated with simulating the circuit design according to the set of simulation parameters;

receive an output in response to the machine learning network processing the functional coverage results, wherein the output comprises:

a target functional coverage statement associated with the circuit design; and a recommended set of the simulation parameters; and simulate the circuit design based on the recommended set of simulation parameters, wherein simulating the circuit design based on the recommended set of simulation parameters comprises generating a set of component signals associated with satisfying the target functional coverage statement.

2. The system of claim 1, wherein:

the set of simulation parameters are provided by the machine learning network; and the instructions are further executable by the processor to provide training data to the machine learning network based on the functional coverage results, wherein providing the training data comprises providing positive reinforcement, negative reinforcement, or both with respect to the set of simulation parameters and the functional coverage results.

3. The system of claim 1, wherein the machine learning network comprises a reinforcement learning network.

4. The system of claim 1, wherein values of the set of simulation parameters are selected by the machine learning network as having a highest reward among candidate values of the set of simulation parameters.

5. The system of claim 4, wherein the candidate values are randomly selected by the machine learning network.

6. The system of claim 1, wherein processing the functional coverage results by the machine learning network comprises tracking the coverage results as a function of the set of simulation parameters.

7. The system of claim 1, wherein the set of simulation parameters comprise:

one or more input conditions associated with simulating the circuit design; and one or more verification parameters associated with setting the one or more input conditions.

8. The system of claim 1, wherein the set of simulation parameters comprise one or more verification environment parameters.

9. The system of claim 1, wherein the set of simulation parameters comprise one or more design configuration parameters.

10. The system of claim 1, wherein:

the functional coverage results associated with simulating the circuit design according to the set of simulation parameters comprise an indication of a first quantity of functional coverage statements satisfied in response to the simulation; and second functional coverage results associated with simulating the circuit design according to the recommended set of simulation parameters comprise an indication of a second quantity of the functional coverage statements satisfied in response to the simulation, wherein the second quantity is larger than the first quantity.

11. The system of claim 1, wherein a result associated with simulating the circuit design based on the recommended set of simulation parameters comprises an increased probability of satisfying the target functional coverage statement.

12. The system of claim 1, wherein a result associated with simulating the circuit design based on the recommended set of simulation parameters comprises achieving a target frequency associated with satisfying the target set of functional coverage statements associated with the circuit design.

13. The system of claim 12, wherein the instructions are further executable by the processor to:

simulate the circuit design according to a plurality of configurations, wherein each configuration of the plurality of configurations comprises a respective set of simulation parameters; and provide, to the machine learning network, training data generated in response to simulating the circuit design according to the plurality of configurations, wherein the machine learning network identifies, in response to processing the training data, that a frequency associated with satisfying the target set of functional coverage statements is less than the target frequency.

14. The system of claim 1, wherein the instructions are further executable by the processor to:

provide, to the machine learning network, training data generated based on simulations of the circuit design according to a plurality of configurations, wherein each configuration of the plurality of configurations comprises a respective set of simulation parameters, wherein the machine learning network learns candidate combinations of the simulation parameters in response to processing the training data, wherein each candidate combination is associated with satisfying a functional coverage statement associated with the circuit design.

15. The system of claim 1, wherein the target functional coverage statement corresponds to a target code depth associated with the circuit design.

16. A system for tuning a set of simulation parameters associated with a design verification environment by:

simulating a circuit design according to a set of simulation parameters;

providing, to a machine learning network, an indication of functional coverage results associated with simulating the circuit design according to the set of simulation parameters;

receiving an output in response to the machine learning network processing the functional coverage results, wherein the output comprises:

a target functional coverage statement associated with the circuit design; and a recommended set of the simulation parameters; and simulating the circuit design based on the recommended set of simulation parameters, wherein simulating the circuit design based on the recommended set of simulation parameters comprises generating a set of component signals associated with satisfying the target functional coverage statement.

17. The system of claim 16, wherein:

the set of simulation parameters are provided by the machine learning network; and the instructions are further executable by the processor to provide training data to the machine learning network based on the functional coverage results, wherein providing the training data comprises providing positive reinforcement, negative reinforcement, or both with respect to the set of simulation parameters and the functional coverage results.

18. The system of claim 16, wherein the machine learning network comprises a reinforcement learning network.

19. The system of claim 16, wherein values of the set of simulation parameters are selected by the machine learning network as having a highest reward among candidate values of the set of simulation parameters.

20. A method comprising:

simulating a circuit design according to a set of simulation parameters;

providing, to a machine learning network, an indication of functional coverage results associated with simulating the circuit design according to the set of simulation parameters;

receiving an output in response to the machine learning network processing the functional coverage results, wherein the output comprises:

a target functional coverage statement associated with the circuit design; and a recommended set of the simulation parameters; and simulating the circuit design based on the recommended set of simulation parameters, wherein simulating the circuit design based on the recommended set of simulation parameters comprises generating a set of component signals associated with satisfying the target functional coverage statement.

* * * * *